(12) United States Patent
Chang et al.

(10) Patent No.: US 12,033,968 B2
(45) Date of Patent: *Jul. 9, 2024

(54) PACKAGE STRUCTURE INCLUDING STACKED PILLAR PORTIONS

(71) Applicant: Taiwan Semiconductor Manufacturing Company, Ltd., Hsinchu (TW)

(72) Inventors: Jung-Hua Chang, Hsinchu (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,864

(22) Filed: May 3, 2023

(65) Prior Publication Data

US 2023/0275055 A1 Aug. 31, 2023

Related U.S. Application Data

(63) Continuation of application No. 17/458,551, filed on Aug. 27, 2021, now Pat. No. 11,682,645, which is a
(Continued)

(51) Int. Cl.
*H01L 21/56* (2006.01)
*H01L 23/00* (2006.01)
(Continued)

(52) U.S. Cl.
CPC ............ *H01L 24/13* (2013.01); *H01L 21/563* (2013.01); *H01L 23/3128* (2013.01); *H01L 23/3185* (2013.01); *H01L 23/49816* (2013.01); *H01L 24/11* (2013.01); *H01L 24/14* (2013.01); *H01L 24/16* (2013.01); *H01L 24/17* (2013.01);
(Continued)

(58) Field of Classification Search
CPC . H01L 25/0652; H01L 25/0657; H01L 24/13; H01L 24/11; H01L 24/16; H01L 24/81; H01L 24/17; H01L 24/14; H01L 23/3185; H01L 21/563; H01L 2924/181; H01L 2225/1085; H01L 23/3128; H01L 23/49816
See application file for complete search history.

(56) References Cited

U.S. PATENT DOCUMENTS 10,304,800 B2 * 5/2019 Chen ................. H01L 24/17
11,139,260 B2 * 10/2021 Chang ............... H01L 24/32
(Continued)

*Primary Examiner* — Alonzo Chambliss
(74) *Attorney, Agent, or Firm* — JCIPRNET

(57) ABSTRACT

A semiconductor structure including an integrated circuit die and conductive bumps is provided. The integrated circuit die includes bump pads. The conductive bumps are disposed on the bump pads. Each of the conductive bumps includes a first pillar portion disposed on one of the bump pads and a second pillar portion disposed on the first pillar portion. The second pillar portion is electrically connected to one of the bump pads through the first pillar portion, wherein a first width of the first pillar portion is greater than a second width of the second pillar portion. A package structure including the above-mentioned semiconductor structure is also provided.

20 Claims, 12 Drawing Sheets

Related U.S. Application Data continuation of application No. 16/572,611, filed on Sep. 17, 2019, now Pat. No. 11,139,260.

(51) Int. Cl.
  *H01L 23/31* (2006.01)
  *H01L 23/498* (2006.01)
  *H01L 25/065* (2023.01)

(52) U.S. Cl.
  CPC .......... *H01L 24/81* (2013.01); *H01L 25/0652* (2013.01); *H01L 25/0657* (2013.01); *H01L 2224/11464* (2013.01); *H01L 2224/13026* (2013.01); *H01L 2224/13083* (2013.01); *H01L 2224/13147* (2013.01); *H01L 2224/13155* (2013.01); *H01L 2224/16013* (2013.01); *H01L 2224/16227* (2013.01); *H01L 2924/181* (2013.01)

(56) References Cited

U.S. PATENT DOCUMENTS

| | | | |
|---|---|---|---|
| 11,682,645 B2* | 6/2023 | Chang | H01L 24/11 257/737 |
| 2006/0113653 A1* | 6/2006 | Xiaoqi | H01L 25/18 257/E25.013 |
| 2013/0009303 A1* | 1/2013 | Tsai | H01L 25/0657 257/737 |
| 2015/0069605 A1* | 3/2015 | Lin | H01L 24/11 257/737 |

* cited by examiner

PACKAGE STRUCTURE INCLUDING STACKED PILLAR PORTIONS

CROSS-REFERENCE TO RELATED APPLICATION

This is a continuation application of and claims the priority benefit of U.S. application Ser. No. 17/458,551, filed on Aug. 27, 2021, now allowed. U.S. application Ser. No. 17/458,551 is a continuation application of and claims the priority benefit of U.S. application Ser. No. 16/572,611, filed on Sep. 17, 2019, now U.S. Pat. No. 11,139,260 B2. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, Chip-On-Wafer-On-Substrate (CoWoS) packaging technology facilitating power-efficient and high-speed computing has been developed. In the packaging process of CoWoS packages, heat dissipation of integrated circuit (IC) dies is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
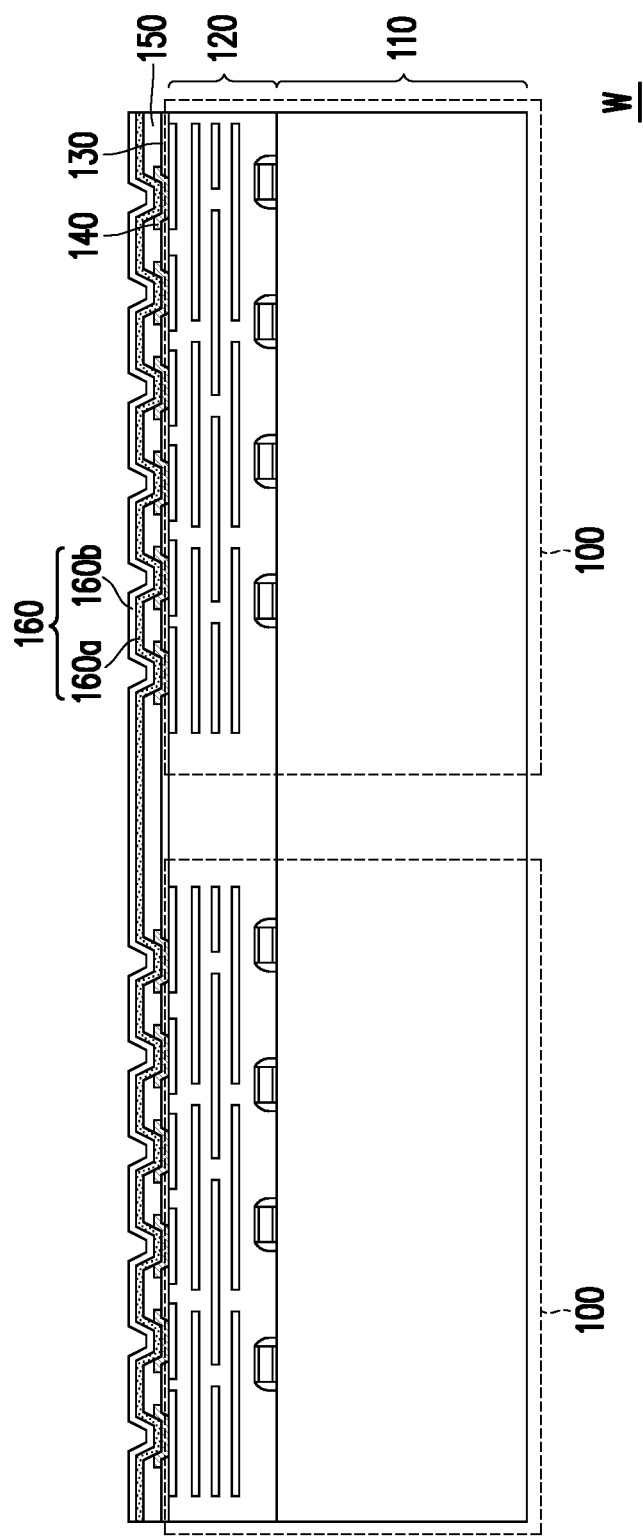
FIGS. 1 through 6 schematically illustrate a process flow for fabricating semiconductor structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 6 schematically illustrate a process flow for fabricating semiconductor structures in accordance with some embodiments of the present disclosure.

Referring to FIG. 1, a semiconductor wafer W including a plurality of semiconductor dies or integrated circuit dies 100 arranged, for example, in array is provided. Before a wafer dicing process is performed on the semiconductor wafer W, the integrated circuit dies 100 included in the semiconductor wafer W are physically connected to one another. In some embodiments, the semiconductor wafer W includes a semiconductor substrate 110, an interconnection structure 120 formed on the semiconductor substrate 110, a passivation layer 130 formed on the interconnection structure 120, a plurality of bump pads 140 formed on the passivation layer 130 and electrically connected to the interconnection structure 120, and a post passivation layer 150 covering the passivation layer 130 and the bump pads 140. The semiconductor substrate 110 may be a silicon substrate including active components (e.g., transistors or the like) and passive components (e.g., resistors, capacitors, inductors or the like) formed therein. The interconnection structure 120 may include a plurality of interconnect wiring layers and a plurality of dielectric layers stacked alternately. The passivation layer 130 covers the interconnection structure 120 and includes a plurality of contact openings such that the topmost interconnect wiring layers of the interconnection structure 120 are exposed through the contact openings of the passivation layer 130. In some embodiments, the passivation layer 130 is a silicon oxide layer, a silicon nitride layer, a silicon oxy-nitride layer or a dielectric layer formed by other suitable dielectric materials. The bump pads 140 are formed in the contact openings of the passivation layer 130 and electrically connected to the topmost interconnect wiring layers of the interconnection structure 120 through the contact opening of the passivation layer 130. In some embodiments, the bump pads 140 are aluminum pads, copper pads or other suitable metal pads. The post passivation layer 150 may include a plurality of contact openings such that the bump pads 140 are partially exposed by the contact openings of the post passivation layer 150. In some embodiments, the post passivation layer 150 is a polyimide (PI) layer, a polybenzoxazole (PBO) layer, or a dielectric layer formed by other suitable polymers.

As shown in FIG. 1, a seed layer 160 for plating is formed onto the post passivation layer 150 and the bump pads 140 exposed by the contact openings of the post passivation layer 150 through, for example, a sputtering process. In some embodiments, the seed layer 160 includes a bottom seed layer 160a entirely formed over the semiconductor wafer W to cover the post passivation layer 150 and the bump pads 140 exposed by the contact openings of the post passivation layer 150, and the seed layer 160 may further include a top seed layer 160b formed on the bottom seed layer 160a. For example, the bottom seed layer 160a includes a sputtered titanium layer, and the top seed layer 160b includes a sputtered copper layer. In some embodiments, the thickness of the bottom seed layer 160a ranges from about 0.05 micrometers to about 0.1 micrometers while the thickness of the top seed layer 160b ranges from about 0.1 micrometers to about 0.5 micrometers.

In some embodiments, the seed layer 160 may include multiple sputtered layers stacked over the semiconductor wafer W. In some alternative embodiments, the seed layer may include a single sputtered layer entirely covering the semiconductor wafer W.

Figure 2:
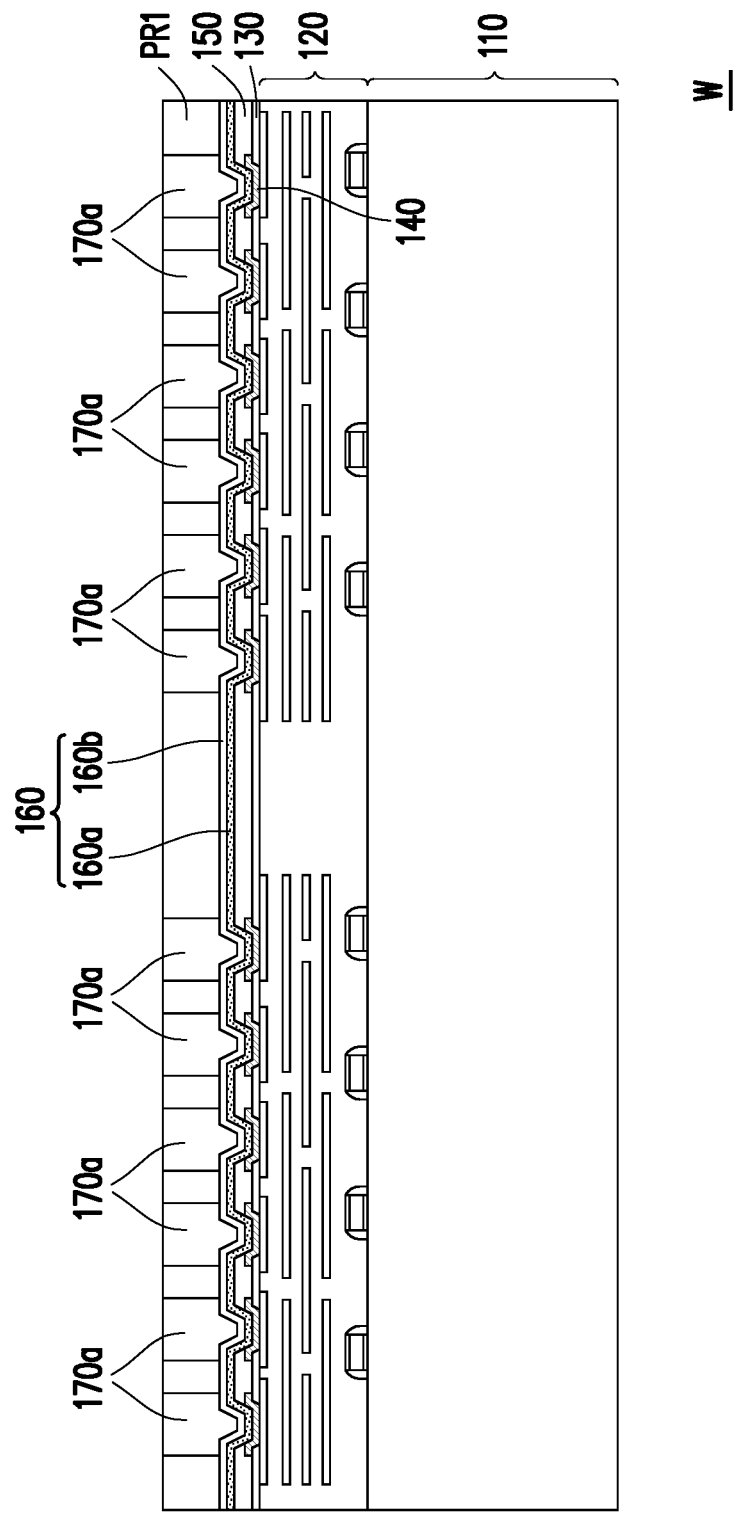

Referring to FIG. 2, a first patterned photoresist layer PR1 is formed on the top seed layer 160b of the seed layer 160 through spin-coating, baking, photolithography, and development processes, for example. The first patterned photoresist layer PR1 includes a plurality of openings arranged in array for exposing portions of the top seed layer 160b that are corresponding to the bump pads 140. In other words, the openings of the first patterned photoresist layer PR1 are located above the bump pads 140. The semiconductor wafer W including the first patterned photoresist layer PR1 formed thereon may be then immersed into a plating solution contained in a plating bath such that a plurality of first pillar portions 170a are plated in the openings of the first patterned photoresist layer PR1. The first pillar portions 170a are plated on the portions of the top seed layer 160b that are corresponding to the bump pads 140. The height of the first pillar portions 170a is determined by the thickness of the first patterned photoresist layer PR1 while the width of the first pillar portions 170a is determined by the openings of the first patterned photoresist layer PR1. The dimensions (e.g., the height and the width) of the first pillar portions 170a will be described in detail in accompany with FIG. 12. In some embodiments, the first pillar portions 170a are plated copper pillars or other suitable conductive pillars.

Figure 3:
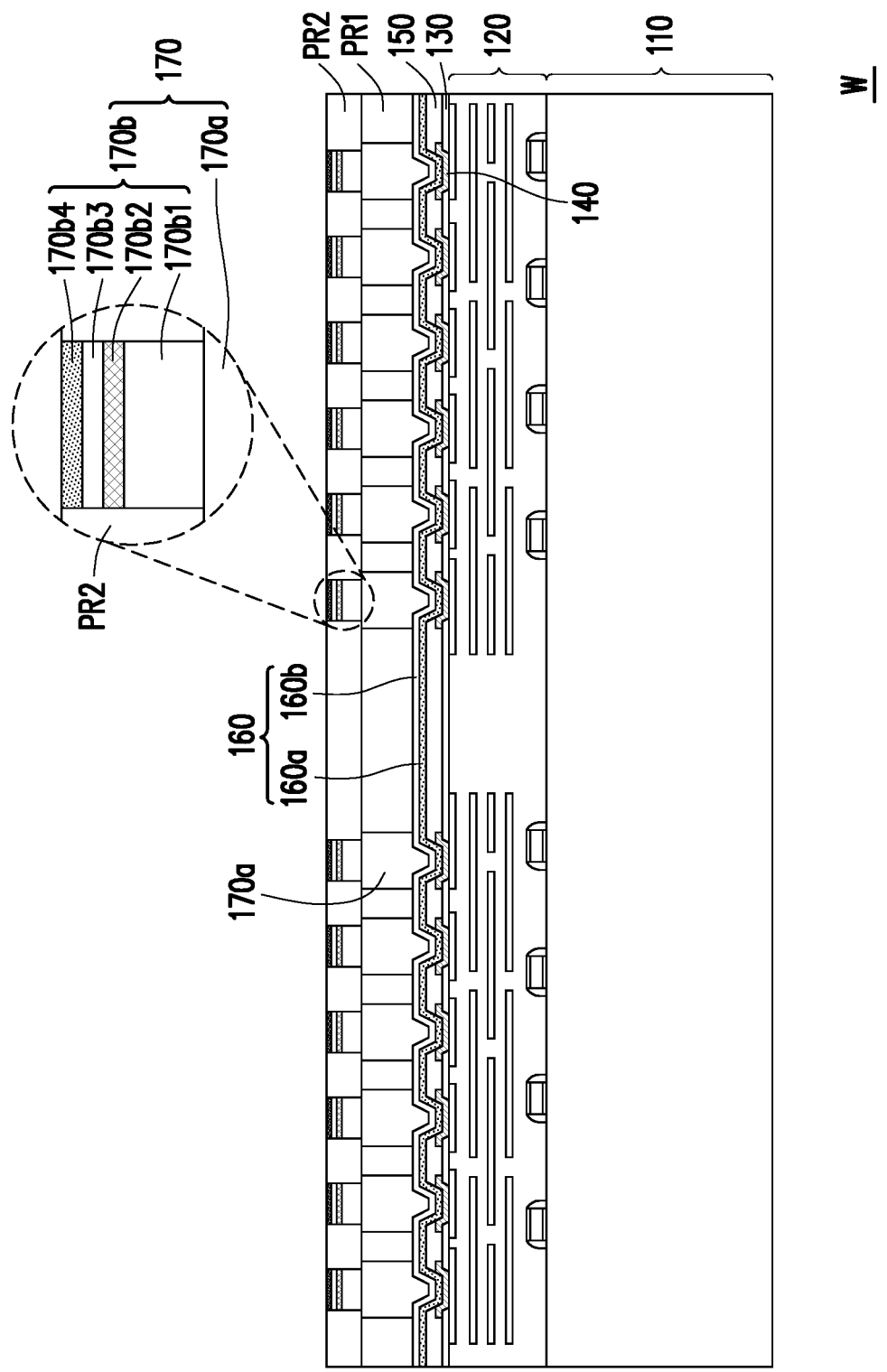

Referring to FIG. 3, after the first pillar portions 170a are formed on the top seed layer 160b of the seed layer 160, a second patterned photoresist layer PR2 is formed on the first patterned photoresist layer PR1 to partially cover the top surfaces of the first pillar portions 170a. The second patterned photoresist layer PR2 is formed through spin-coating, baking, photolithography, and development processes, for example. The second patterned photoresist layer PR2 includes a plurality of openings arranged in array for exposing portions of the top surfaces of the first pillar portions 170a. The openings of the second patterned photoresist layer PR2 are located above the bump pads 140. In some embodiments, the width of the openings defined in the second patterned photoresist layer PR2 are smaller than the width of the openings the openings defined in the second patterned photoresist layer PR2, the openings defined in the second patterned photoresist layer PR2 are substantially aligned with the openings defined the first patterned photoresist layer PR1 and the first pillar portions 170a.

The semiconductor wafer W including the first patterned photoresist layer PR1, the first pillar portions 170a, and the second patterned photoresist layer PR2 formed thereon may be then immersed into plating solutions contained in plating baths such that a plurality of second pillar portions 170b are plated in the openings defined in the second patterned photoresist layer PR2. The second pillar portions 170b are plated and land on the top surfaces of the first pillar portions 170a such that a plurality of conductive bumps 170 are formed. The height of the second pillar portions 170b is determined by the thickness of the second patterned photoresist layer PR2 while the width of the second pillar portion 170b is determined by the openings of the second patterned photoresist layer PR2. The dimensions (e.g., the height and the width) of the second pillar portions 170b will be described in more detail in accompany with FIG. 12.

As illustrated in FIG. 3, the width of the second pillar portions 170b are smaller than the width of the first pillar portions 170a while the height of the second pillar portions 170b are smaller than the height of the first pillar portions 170a. Each of the second pillar portions 170b may be substantially aligned with one of the first pillar portions 170a, respectively. In some embodiments, the first pillar portions 170a and the second pillar portions 170b may be cylindrical pillars, and each one of the second pillar portions 170b is concentrically stacked on one of the first pillar portions 170a.

In some embodiments, the second pillar portions 170b are multi-layered pillars including a plated layer 170b1, a plated layer 170b2, a plated layer 170b3, and a plated layer 170b4, wherein the plated layer 170b1 includes a plated copper layer, the plated layer 170b2 includes a plated nickel layer, the plated layer 170b3 includes another plated copper layer, and the plated layer 170b3 includes lead-free solder material layer. For example, the thickness of the plated layer 170b1 (e.g., plated copper layer) ranges from about 10 micrometers to about 100 micrometers, the thickness of the plated layer 170b2 (e.g., plated nickel layer) ranges from about 3 micrometers to about 10 micrometers, the thickness of the plated layer 170b3 (e.g., plated copper layer) ranges from about 3 micrometers to about 10 micrometers, and the thickness of the plated layer 170b4 (e.g., lead-free solder material layer) ranges from about 3 micrometers to about 30 micrometers.

Figure 4:
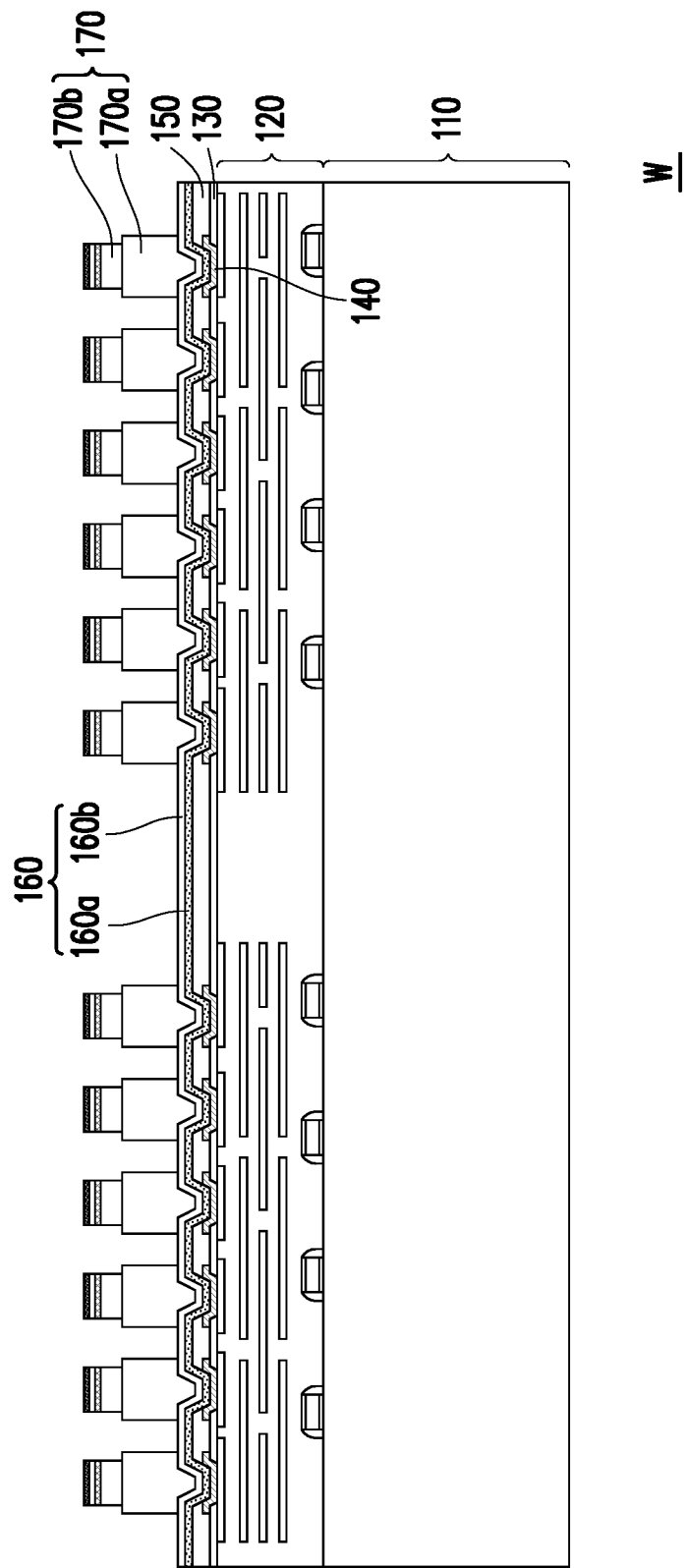

Referring to FIG. 3 and FIG. 4, after the first pillar portions 170a and the second pillar portions 170b are formed, the first patterned photoresist layer PR1 and the second patterned photoresist layer PR2 are removed such that portions of the seed layer 160 that are not covered by the first pillar portions 170a are revealed. In some embodiments, the first patterned photoresist layer PR1 and the second patterned photoresist layer PR2 are removed through a stripping process simultaneously.

In some embodiments, the conductive bumps 170 each including the first pillar portion 170a and the second pillar portion 170b may be formed through a two-step plating process as illustrated in FIG. 2 and FIG. 3. In other words, the bumping process for forming the conductive bumps 170 is the two-step plating process as illustrated in FIG. 2 and FIG. 3. In some alternative embodiments, each of the conductive bumps 170 may include multiple stacked pillar portions (e.g., three or more stacked pillar portions), and the stacked pillar portions may be formed through a multiple-step plating process. Take the three-step plating process as an example, a plurality of first pillar portions are selectively plated on the seed layer 160 as illustrated in FIG. 2 by using a first patterned photoresist layer, then, a plurality of second pillar portions are selectively plated on the first pillar portions by using a second patterned photoresist layer, and a plurality of third pillar portions are selectively plated on the second pillar portions by using a third patterned photoresist layer. Then, the first, second and third patterned photoresist layers may be removed through a stripping process simultaneously.

Figure 5:
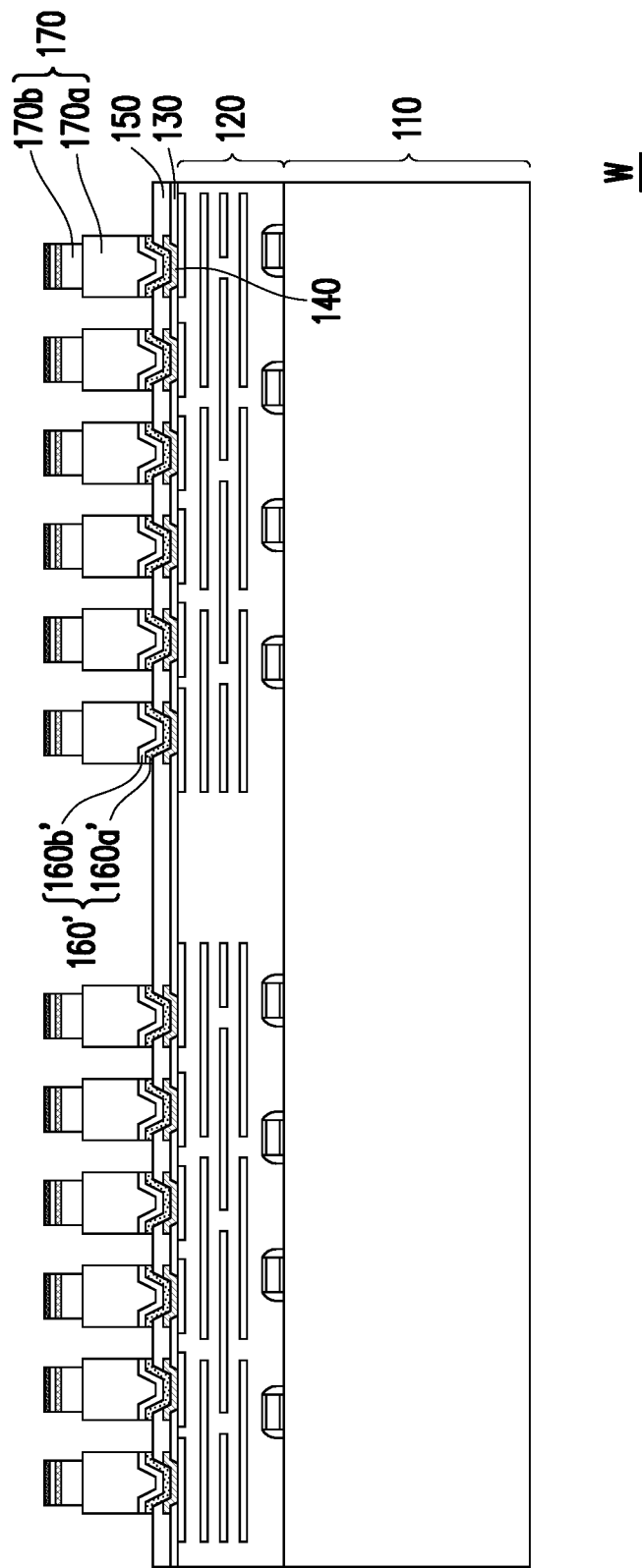

Referring to FIG. 4 and FIG. 5, by using the first pillar portions 170a and the second pillar portions 170b as a hard mask, portions of the seed layer 160 that are not covered by the first pillar portions 170a and the second pillar portions 170b are removed through an etching process, for example, until the post passivation layer 150 is revealed. After the portions of the seed layer 160 that are not covered by the first pillar portions 170a and the second pillar portions 170b are remove, a plurality of seed patterns 160' are formed, wherein each one of the seed patterns 160' includes a first seed pattern 160a' and a second seed pattern 160b'. The first seed patterns 160a' cover portions of the post passivation 150 and land on central portions of the bump pads 140 while the second seed patterns 160b' are between the first seed patterns 160a' and the first pillar portions 170a.

Figure 6:
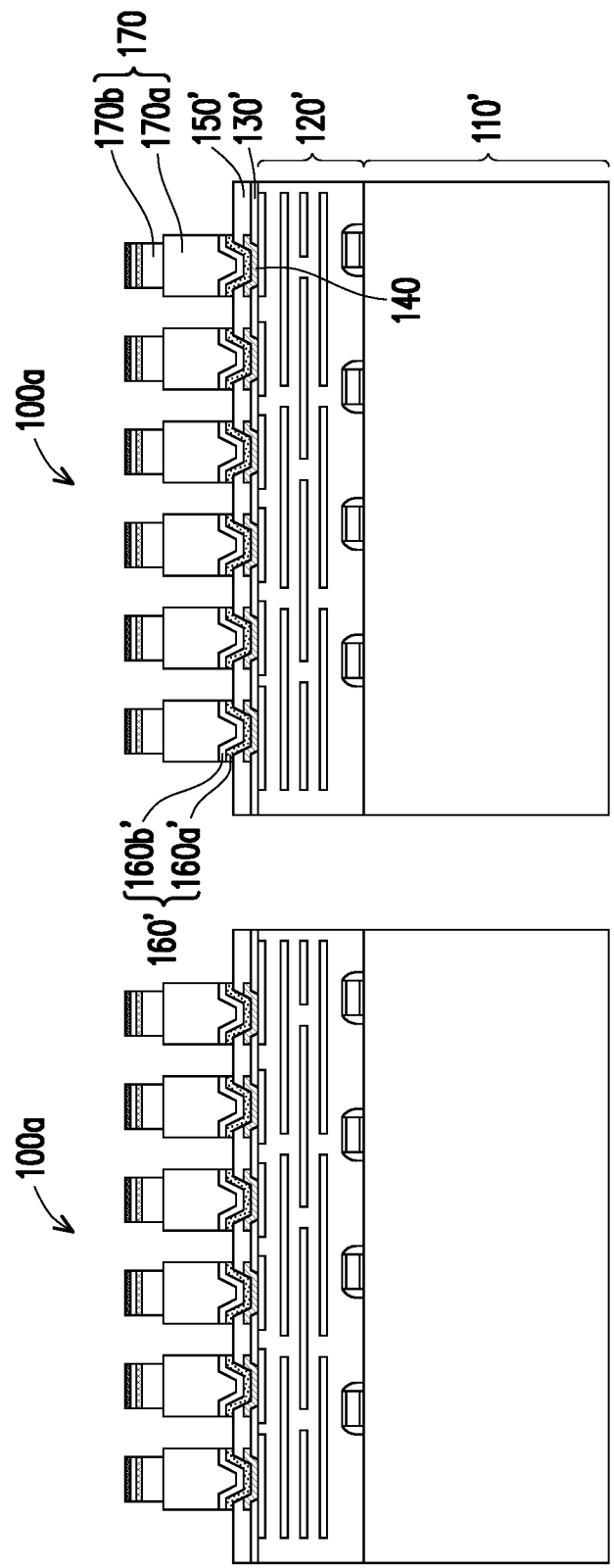
Figure 9:
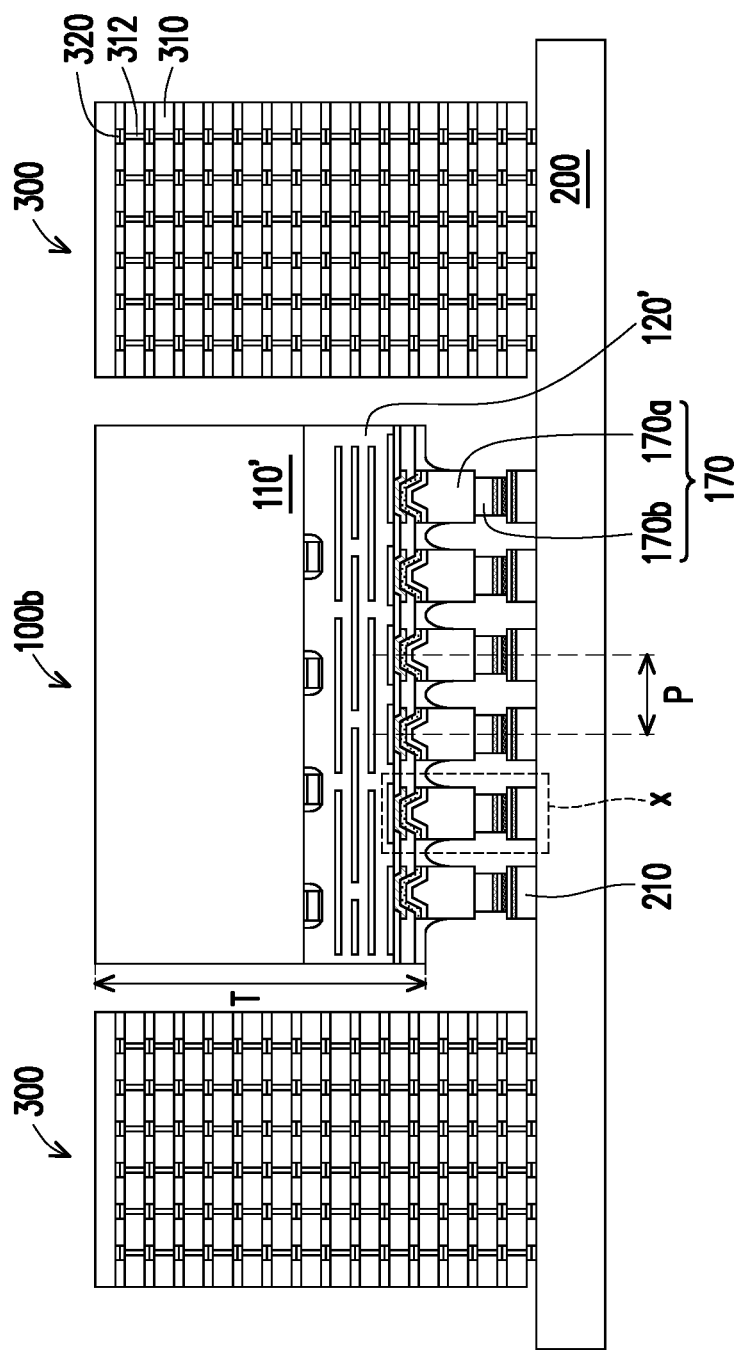
FIGS. 9 through 11 schematically illustrates a process flow for fabricating a package structure in accordance with some embodiments of the present disclosure.

Referring to FIG. 5 and FIG. 6, after performing the bumping process over the semiconductor wafer W, the semiconductor wafer W including the conductive bumps 170 and the seed patterns 160' formed thereon is singulated such that a plurality of singulated integrated circuit dies 100a are obtained. In some embodiments, in order to match the thickness of memory cubes 300 as illustrated in FIG. 9, no thinning process is required to thin down the semiconductor wafer W before singulation of the semiconductor wafer W. As illustrated in FIG. 6, each singulated integrated circuit die 100a includes a singulated semiconductor substrate 110', a singulated interconnection structure 120', a singulated passivation layer 130', the bump pads 140, a singulated post passivation layer 150', the seed patterns 160', and the conductive bumps 170. In the singulated integrated circuit die 100a, the singulated interconnection structure 120' is disposed on the singulated semiconductor substrate 110'; the singulated passivation layer 130' covers the singulated interconnection structure 120'; the bump pads 140 are disposed on and electrically connected to the singulated interconnection structure 120'; the singulated post passivation layer 150' covers the singulated passivation layer 130' and portions of the conductive bumps 140; and the seed patterns 160' and the conductive bumps 170 are disposed on and electrically connected to the bump pads 140.

Figure 7:
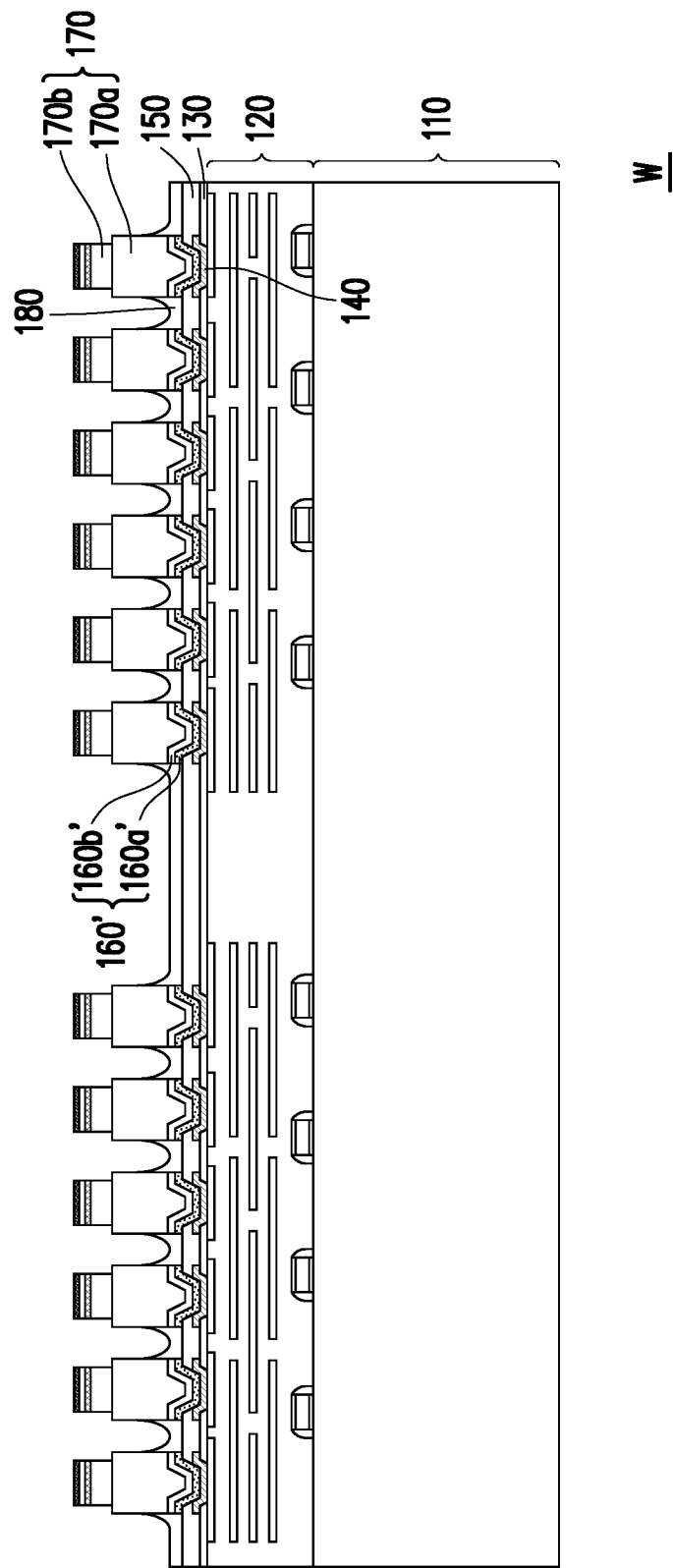
FIGS. 7 and 8 schematically illustrate another process flow for fabricating semiconductor structures in accordance with some embodiments of the present disclosure.
Figure 8:
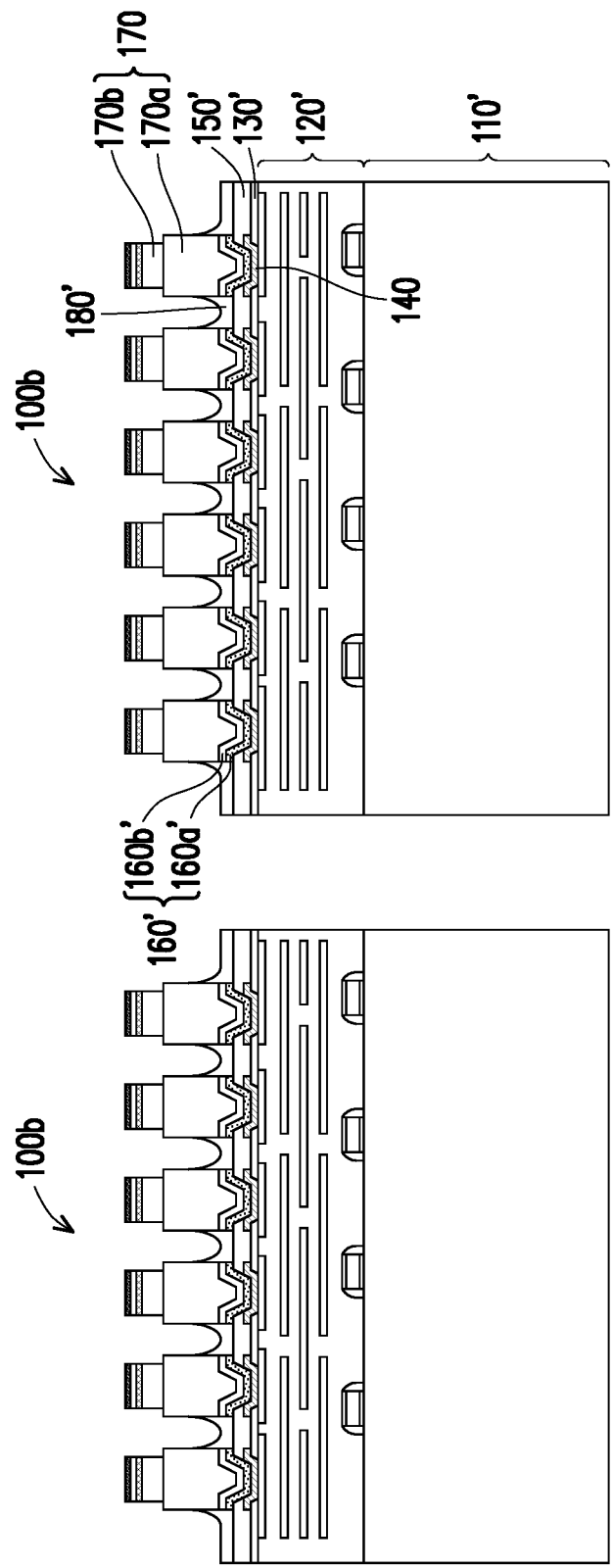

FIGS. 7 and 8 schematically illustrate another process flow for fabricating semiconductor structures in accordance with some embodiments of the present disclosure.

Referring to FIG. 7, after performing the bumping process as illustrated in FIG. 5, a dielectric material layer 180 may be formed over the post passivation layer 150 of the semiconductor wafer W. For example, the dielectric material layer 180 is formed through a dispensing process followed by a curing process. In some embodiments, the dielectric material layer 180 may laterally encapsulates the seed patterns 160' and extend upwardly along the sidewalls of the conductive bumps 170. As illustrated in FIG. 7, in some embodiments, the sidewalls of the first pillar portions 170a are partially covered by the dielectric material layer 180 such that the dielectric material layer 180 may be enhance reliability of the conductive bumps 170 with high aspect ratio (e.g., greater than 5). In some alternative embodiments, the dielectric material layer 180 may further extend to cover portions of the sidewalls of the second pillar portions 170b.

Referring to FIG. 7 and FIG. 8, after performing the bumping process on the semiconductor wafer W, the semiconductor wafer W including the seed patterns 160', the conductive bumps 170, and the dielectric material layer 180 formed thereon is singulated such that a plurality of singulated integrated circuit dies 100b are obtained. As illustrated in FIG. 8, each singulated integrated circuit die 100b includes a singulated semiconductor substrate 110', a singulated interconnection structure 120', a singulated passivation layer 130', the bump pads 140, a singulated post passivation layer 150', the seed patterns 160', the conductive bumps 170, and a singulated dielectric material layer 180'. In the singulated integrated circuit die 100b, the singulated interconnection structure 120' is disposed on the singulated semiconductor substrate 110'; the singulated passivation layer 130' covers the singulated interconnection structure 120'; the bump pads 140 are disposed on and electrically connected to the singulated interconnection structure 120'; the singulated post passivation layer 150' covers the singulated passivation layer 130' and portions of the conductive bumps 140; the seed patterns 160' and the conductive bumps 170 are disposed on and electrically connected to the bump pads 140; and the singulated dielectric material layer 180' covers the singulated post passivation layer 150' and is in contact with the seed patterns 160' and at least portions of the sidewalls of the first pillar portions 170a. In some embodiments, the singulated dielectric material layer 180' may be dielectric material containing no filler.

Figure 10:
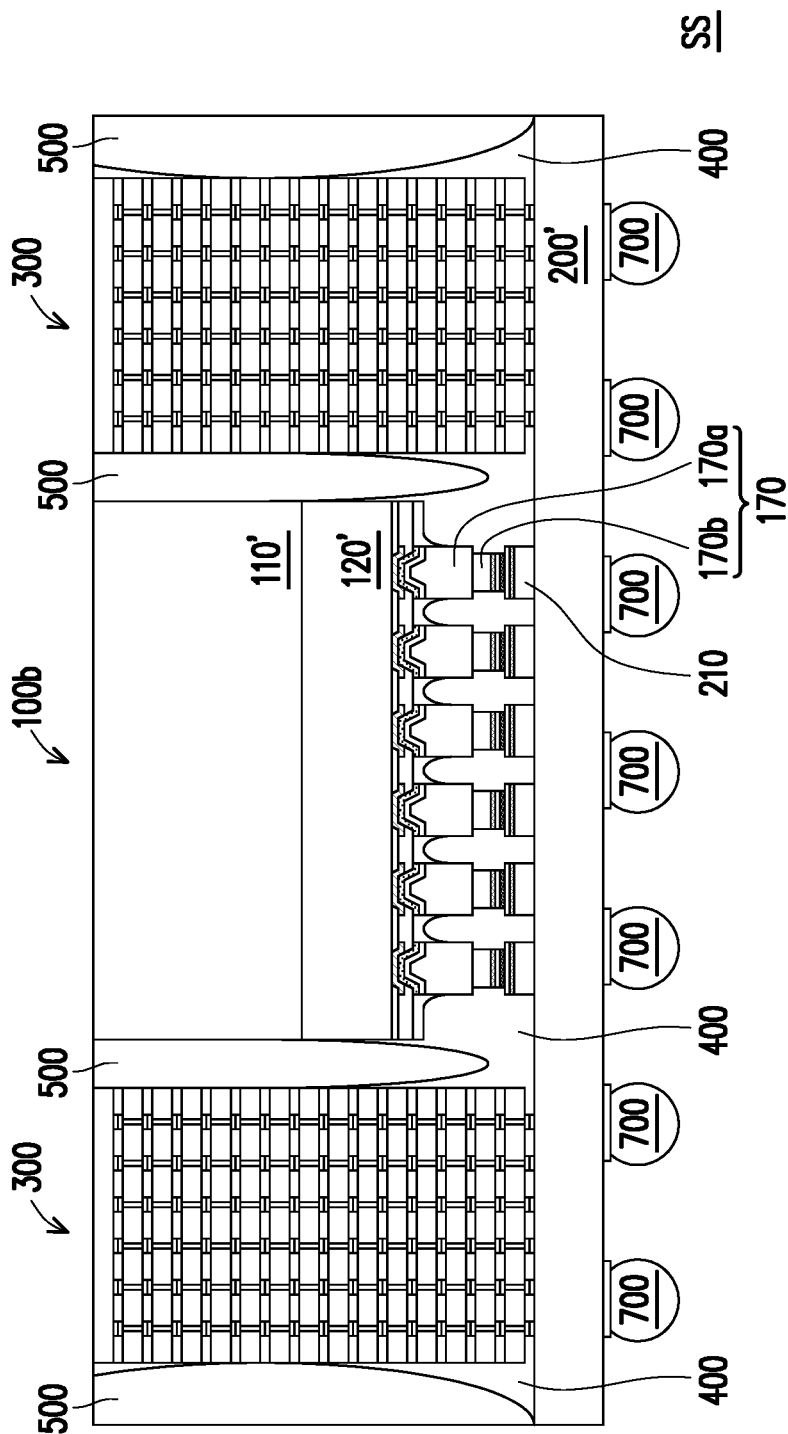
Figure 11:
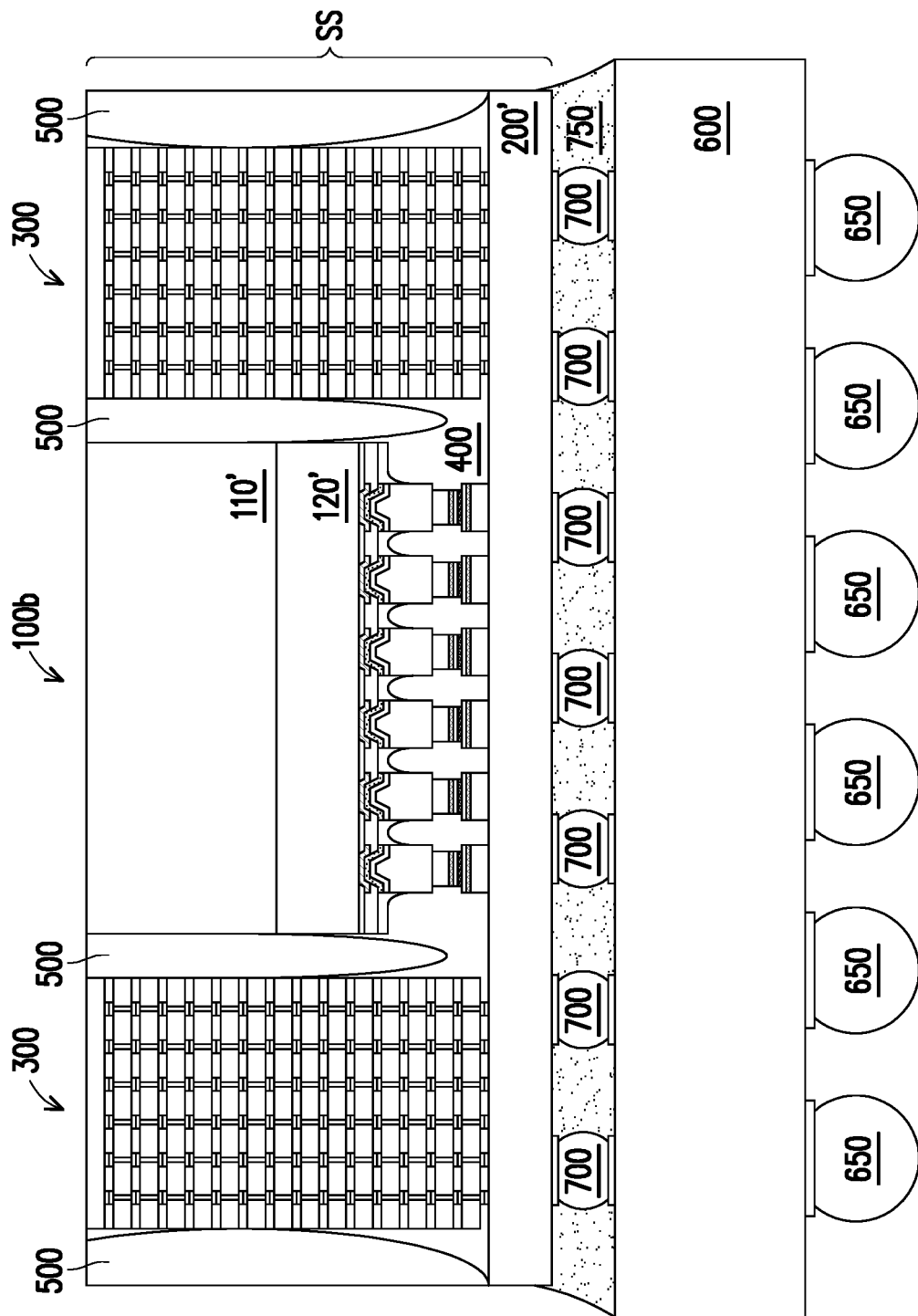
Figure 12:
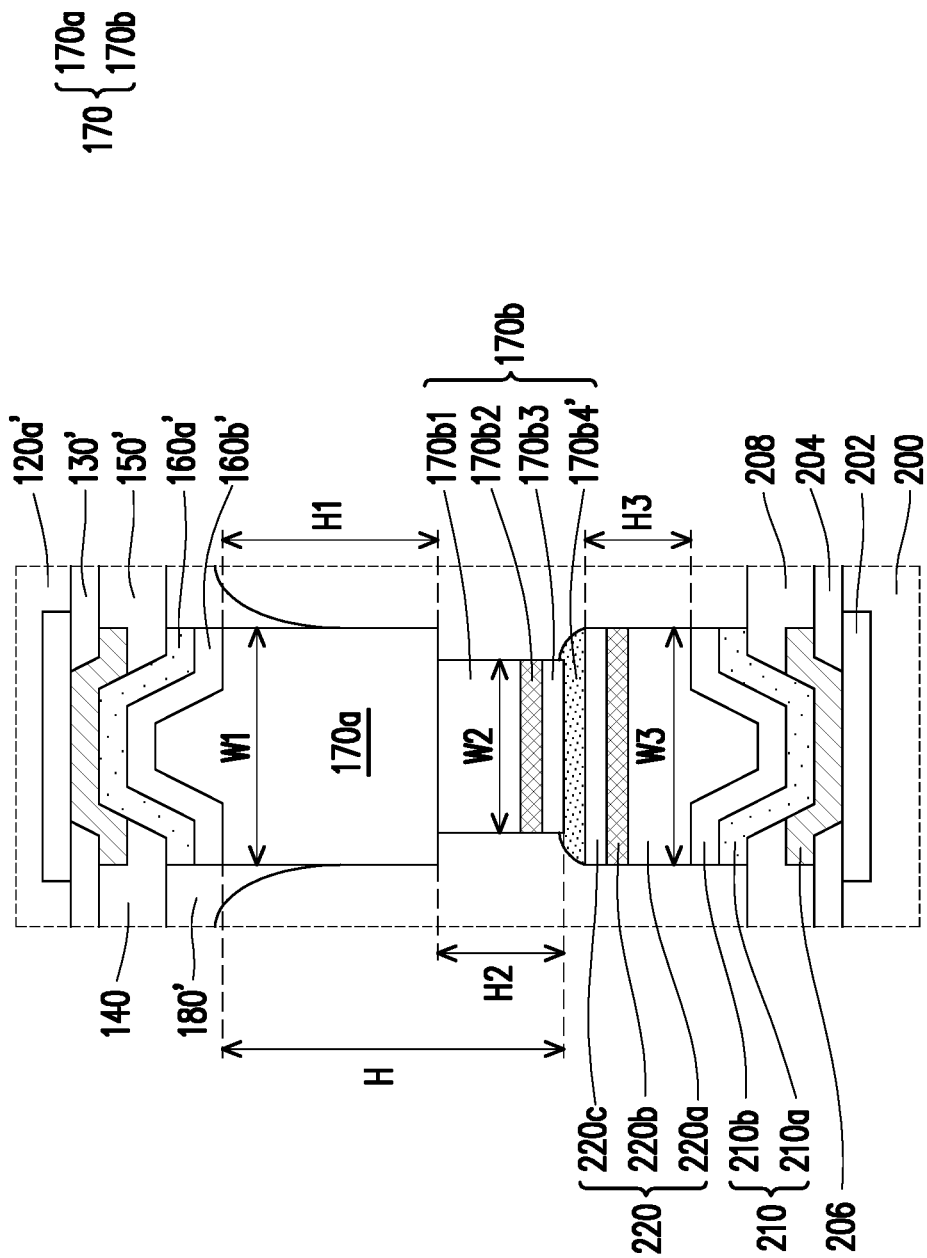
FIG. 12 schematically illustrates an enlarged cross-sectional view of the region X of FIG. 9.

FIGS. 9 through 11 schematically illustrates a process flow for fabricating a package structure in accordance with some embodiments of the present disclosure. FIG. 12 schematically illustrates an enlarged cross-sectional view of the region X of FIG. 9.

Referring to FIG. 9, an interposer wafer 200 including a plurality of conductive bumps 210 formed thereon is provided and an integrated circuit die is picked-up and flipped onto the interposer wafer 200. After the integrated circuit die is picked-up and flipped onto the interposer wafer 200, a reflow process is performed to bond the integrated circuit die onto the interposer wafer 200. In some embodiments, one of the singulated integrated circuit dies 100b illustrated in FIG. 8 is picked-up and placed onto the interposer wafer 200 such that the singulated integrated circuit die 100b is electrically connected to the interposer wafer 200, for example, by the reflow process. The number of the singulated integrated circuit die 100b is not limited in the present application. Other types of integrated circuit dies including conductive bumps with high aspect ratio may be picked-up and placed onto the interposer wafer 200. For example, one of the singulated integrated circuit dies 100a illustrated in FIG. 6 is picked-up and placed onto the interposer wafer 200 such that the singulated integrated circuit die 100a is electrically connected to the interposer wafer 200, for example, by the reflow process. The number of the singulated integrated circuit die 100a is not limited in the present application.

After performing the bonding of the singulated integrated circuit die 100b and the interposer wafer 200, one or more memory cubes 300 (e.g. high bandwidth memory cubes) are provided and placed onto the interposer wafer 200. After the memory cubes 300 are picked-up and placed onto the interposer wafer 200, a reflow process is performed to bond the memory cubes 300 onto the interposer wafer 200. In some embodiments, each of the memory cubes 300 includes a plurality of stacked memory dies 310 (or memory integrated circuit chips) and conductive bumps 320, wherein each memory die 310 respectively includes a plurality of through semiconductor vias (TSVs) 312 formed therein, and the through semiconductor vias 312 in different tiers of the stacked memory dies 310 are electrically connected through the conductive bumps 320. In some other embodiments, not illustrated in FIG. 9, each of the memory cubes includes a logic die (or a logic integrated circuit chip), a plurality of stacked memory dies disposed on the logic die, and conductive bumps, wherein each one of the logic die and the memory dies respectively includes a plurality of through semiconductor vias formed therein, the logic die is electrically connected to the bottommost tier of memory die through the conductive bumps, and the through semiconductor vias in different tiers of the stacked memory dies are electrically connected through conductive bumps. In some alternative embodiments, not illustrated in FIG. 9, each of the memory cubes includes a logic die, a plurality of stacked memory dies disposed on the logic die, conductive bumps, and an insulating encapsulation (e.g., a molding compound), wherein each one of the logic die and the memory dies respectively includes a plurality of through semiconductor vias formed therein, the logic die is electrically connected to the bottommost tier of memory die through the conductive bumps, the through semiconductor vias in different tiers of the stacked memory dies are electrically connected through conductive bumps, and the insulating encapsulation encapsulating the logic die and the stacked memory dies. The configuration of the memory cubes 300 is merely for illustration and is not limited in the present application.

In some embodiments, the memory cubes 300 includes more than eight memory (e.g., nine to twelve stacked memory dies are included in each memory cube 300) and an overall thickness of the memory cubes 300 ranges from about 875 micrometers to about 925 micrometers, wherein the thickness of each memory die 310 ranges from about 20 micrometers to about 200 micrometer, and the bump height of the conductive bumps 320 ranges from about 20 micrometers to about 80 micrometer.

As illustrated in FIG. 9 and FIG. 12, after performing the reflowing process, the singulated integrated circuit die 100b is physically and electrically connected to the interposer wafer 200 through the conductive bumps 170 and the conductive bumps 210. As illustrated in FIG. 12, the interposer wafer 200 includes a plurality of conductive wirings 202, a passivation layer 204, a plurality of bump pads 206, and a post passivation layer 208. The passivation layer 204 includes a plurality of contact openings for exposing portions of the conductive wirings 202. In some embodiments, the passivation layer 204 is a silicon oxide layer, a silicon nitride layer, a silicon oxy-nitride layer or a dielectric layer formed by other suitable dielectric materials. The bump pads 206 are formed on the passivation layer 204 and the exposed portions of the conductive wirings 202 such that the bump pads 206 are electrically connected to the conductive wirings 202 through the contact openings in the passivation layer 204. The post passivation layer 208 may include a plurality of contact openings such that the bump pads 206 are partially exposed by the contact openings of the post passivation layer 208. For example, the post passivation layer 208 is a polyimide (PI) layer, a polybenzoxazole (PB 0) layer, or a dielectric layer formed by other suitable polymers.

As illustrated in FIG. 12, a plurality of seed patterns 210 each including multiple stacked seed patterns are formed to cover the exposed bump pads 206 and portions of the post passivation layer 208. In some embodiments, each seed pattern includes a first seed pattern 210a and a second seed pattern 210b, wherein the first seed pattern 210a covers the exposed bump pads 206 and portions of the post passivation layer 208, and the second seed pattern 210b is disposed on the first seed pattern 210a. For example, the first seed layer 210a includes a sputtered titanium layer, and the second seed layer 210b includes a sputtered copper layer. In some embodiments, the thickness of the first seed layer 210a ranges from about 0.05 micrometers to about 0.1 micrometers while the thickness of the second seed layer 210b ranges from about 0.1 micrometers to about 0.5 micrometers. Furthermore, a plurality of conductive bumps 220 are formed on the seed patterns 210 through, for example, a plating process. In some embodiments, the conductive bumps 220 are multi-layered pillars each including a plated layer 220a, a plated layer 220b, and a plated layer 220c, wherein the plated layer 220a includes a plated copper layer, the plated layer 220b includes a plated nickel layer, and the plated layer 220c includes another plated copper layer. In some embodiments, each of the conductive bumps 220 further includes lead-free solder material layer disposed on the plated layer 220c. For example, the thickness of the plated layer 220a (e.g., plated copper layer) ranges from about 3 micrometers to about 20 micrometers, the thickness of the plated layer 220b (e.g., plated nickel layer) ranges from about 3 micrometers to about 10 micrometers, the thickness of the plated layer 220c (e.g., plated copper layer) ranges from about 3 micrometers to about 10 micrometers, and the thickness of the lead-free solder material layer ranges from about 3 micrometers to about 20 micrometers.

As illustrated in FIG. 12, after performing the reflowing process, the plated layer 170b4 (e.g., lead-free solder material layer as illustrated in FIG. 3) of the conductive bumps 170 and the lead-free solder material layer of the conductive bumps 220 melt and re-shape to formed a soldering or bonding layer 170b4' between the plated layer 170b3 and the plated layer 220c.

In some embodiments, the ratio of the first width W1 of the first pillar portions 170a to the arrangement pitch P (as illustrated in FIG. 9) of the conductive bumps 170 ranges from about 0.7 to about 0.8. For example, the arrangement pitch P of the conductive bumps 170 ranges from about 10 micrometers to about 100 micrometers, the first width W1 of the first pillar portions 170a ranges from about 5 micrometers to about 80 micrometers, the first height H1 of the first pillar portions 170a ranges from about 30 micrometers to about 300 micrometers, and the aspect ratio of the first pillar portions 170a ranges from about 0.5 to about 8.

In some embodiments, the ratio of the second width W2 of the second pillar portions 170b to the arrangement pitch P (as illustrated in FIG. 9) of the conductive bumps 170 ranges from about 0.4 to about 0.6. For example, the arrangement pitch P of the conductive bumps 170 ranges from about 10 micrometers to about 100 micrometers, and the second width W2 of the second pillar portions 170b ranges from about 3 micrometers to about 70 micrometers, the second height H2 of the second pillar portions 170b ranges from about 10 micrometers to about 100 micrometers, and the aspect ratio of the second pillar portions 170b ranges from about 0.5 to about 8.

In some embodiments, the first width W1 of the first pillar portion 170a is greater than the second width W2 of the second pillar portion 170b. For example, the ratio of the second width W2 of the second pillar portion 170b to the first width W1 of the first pillar portion 170a is greater than about 0.5 and less than about 1.

In some embodiments, the first height H1 of the first pillar portion 170a is substantially equal to or greater than the second height H2 of the second pillar portion 170b. For example, the ratio of the first height H1 of the first pillar portion 170a to the second height H2 of the second pillar portion 170b ranges from about 1 to about 5.

In some embodiments, the height H of the conductive bumps 170 ranges from about 20 micrometers to about 400 micrometers, and the thickness T of the integrated circuit die 100b ranges from about 300 micrometers to about 800 micrometers. For example, the ratio of the height H of the conductive bumps 170 to the thickness T of the integrated circuit die 100b ranges from about 0.05 to about 1.

In some embodiments, the ratio of the height H of the conductive bumps 170 to the first width W1 of the first pillar portion 170a (i.e. the aspect ratio of the conductive bumps 170) ranges from about 2 to about 10.

In some embodiments, the second width W2 of the second pillar portion 170b of the conductive bump 170 is less than the third width W3 of the conductive bump 220 while the third width W3 of the conductive bump 220 is substantially equal to the first width W1 of the first pillar portion 170a. For example, the third width W3 of the conductive bump 220 ranges from about 3 micrometers to about 70 micrometers, the height H3 of the conductive bump 220 ranges from about 5 micrometers to about 30_ micrometers, and the aspect ratio of the conductive bump 220 ranges from about 0.5 to about 5. Furthermore, the height H of the conductive bump 170 is greater than the height H3 of the conductive bump 220.

In some embodiments, not illustrated in FIG. 12, the second width W2 of the second pillar portion 170b of the conductive bump 170 is less than the third width W3 of the conductive bump 220 while the third width W3 of the conductive bump 220 is greater than or less than the first width W1 of the first pillar portion 170a.

As illustrated in FIG. 12, the height H of the conductive bumps 170 may be about 0.5 times to about 10 times of the thickness of each memory die 310. Furthermore, the sum of the height H of the conductive bumps 170 and the height H3 of the conductive bumps 220 may be about 0.1 times to about 3 times of the thickness of each memory die 310. For example, the thickness of each memory die 310 ranges from about 20 micrometers to about 200 micrometers.

Referring to FIG. 10, after the memory cubes 300 and the singulated integrated circuit die 100b are bonded onto the interposer wafer 200, an underfill material 400 is formed over the interposer wafer 200 through, for example, a dispensing process. The underfill material 400 is formed to encapsulate the conductive bumps 170, the conductive bumps 220. In some embodiments, the underfill material 400 not only fills the spacing between the singulated integrated circuit die 100b and the interposer wafer 200, but also laterally encapsulates sidewalls of the singulated integrated circuit dies 100b and the sidewalls of the memory cubes 300. Depending upon the dispensing amount, the underfill material 400 may partially fill or entirely fill the gaps between the singulated integrated circuit die 100b and the memory cubes 300.

After forming the underfill 400 over the interposer wafer 200, an insulating encapsulation 500 is formed to laterally encapsulate the singulated integrated circuit die 100b and the memory cubes 300 such that the rear surface of the integrated circuit die 100b is accessibly exposed from the insulating encapsulation 500. After forming the insulating encapsulation 500, a plurality of conductive bumps 700 (e.g., Controlled Collapse Chip Connection (C4) bumps) are formed on the lower surface of the interposer wafer 200 such that the conductive bumps 700 are electrically connected to the singulated integrated circuit dies 100b and the sidewalls of the memory cubes 300 through the interposer wafer 200. Then, a singulation process is performed such that a plurality of semiconductor structures SS are obtained. As illustrated in FIG. 10, after performing the singulation process, fabrication of semiconductor structures SS each including the integrated circuit die 100b and an interposer 200' is accomplished.

In some embodiments, the insulating encapsulation 500 is formed by a molding process (e.g., over-molding process) followed by a grinding process (e.g., mechanical grinding process and/or chemical mechanical polishing process). The above-mentioned grinding process is utilized to partially the molding compound of the insulating encapsulation 500 to reveal rear surface of the integrated circuit die 100b and portions of the memory cubes 300 such that the heat dissipation performance of the semiconductor structure SS may be enhanced.

As illustrated in FIG. 10, in this embodiment, since the thickness of the integrated circuit die 100b and aspect ratio of the conductive bumps 170 and 220 is high enough to match with the relative high thickness (e.g., about 900 micrometers) of the memory cubes 300, the rear surface of the integrated circuit die 100b is not covered by the insulating encapsulation 500 and accessibly exposed from the insulating encapsulation 500. Accordingly, the heat dissipation performance of the semiconductor structure SS illustrated in FIG. 10 is enhanced.

Referring to FIG. 11, the semiconductor structure SS is picked-up and placed onto a wiring substrate 600 (e.g., printed circuit board) including a plurality of conductive terminals 650 (e.g., solder balls). In some embodiments, the semiconductor structure SS is mounted on the upper surface of the wiring substrate 600 and the conductive terminals 650 are disposed on the lower surface of the wiring substrate 600. In some embodiments, an underfill material 750 is formed on the upper surface of the wiring substrate 600 to fill the gap between the interposer 200' and the wiring substrate 600. The underfill material 750 encapsulates the conductive bumps 700 and enhances the reliability of the package structure as illustrated in FIG. 11.

In accordance with some embodiments of the present disclosure, a package structure including a substrate, a semiconductor die disposed over the substrate, first conductive pillars disposed on and electrically connected to the semiconductor die, second conductive pillars disposed between the first conductive pillars and the substrate and a memory device disposed on and electrically connected to the substrate is provided. A first width of the first conductive pillars is greater than a second width of the second conductive pillars. A memory device disposed on and electrically connected to the substrate, wherein a first distance between the semiconductor die and the substrate is greater than a second distance between the memory device and the substrate. In some embodiments, the substrate comprises conductive bumps, the second conductive pillars are disposed between the first conductive pillars and the conductive bumps of the substrate, a third width of the conductive bumps is greater than the second width of the second conductive pillars, and the third width of the conductive bumps is substantially equal to the first width of the first conductive pillars. In some embodiments, the substrate comprises conductive bumps, the second conductive pillars are disposed between the first conductive pillars and the conductive bumps of the substrate, a third width of the conductive bumps is greater than the second width of the second conductive pillars, and the third width of the conductive bumps is different from the first width of the first conductive pillars. In some embodiments, a ratio of a first height of the first conductive pillars to a second height of the second conductive pillars ranges from about 1 to about 5. In some embodiments, a ratio of the second width to the first width is greater than about 0.5 and less than about 1. In some embodiments, the first conductive pillars are wider than and a higher than the second conductive pillars. In some embodiments, the package structure further includes a dielectric layer partially encapsulating sidewalls of the first conductive pillars, wherein the dielectric layer is not in contact with the second conductive pillars. In some embodiments, the package structure further includes an insulating encapsulation laterally encapsulating the semiconductor die and the memory device.

In accordance with some embodiments of the present disclosure, a structure including a substrate, a semiconductor die disposed over the substrate, first conductive bumps disposed between and electrically connected to the substrate and the semiconductor die, a memory device disposed on and electrically connected to the substrate, and second conductive bumps disposed between and electrically connected to the substrate and the memory device is provided. At least one of the first conductive bumps includes a first pillar portion and a second pillar portion, wherein the first pillar portion and the second pillar portion are different in width. The first conductive bumps are higher than the second conductive bumps in relation to the substrate. In some embodiments, the structure further includes an insulating encapsulation laterally encapsulating the semiconductor die and the memory device. In some embodiments, a rear surface of the semiconductor die is substantially leveled with a top surface of the memory device, and the rear surface of the semiconductor die and the top surface of the memory device are substantially leveled with a surface of the insulating encapsulation. In some embodiments, the substrate comprises third conductive bumps in contact with and electrically connected to the first conductive bumps. In some embodiments, the first pillar portion is wider than the second pillar portion, and the third conductive bumps are wider than the second pillar portion. In some embodiments, the first pillar portion is wider than the second pillar portion, and the first pillar portion and the third conductive bumps are substantially identical in width. In some embodiments, the structure further includes a dielectric layer an underfill, wherein the dielectric layer encapsulates first sidewall portions of the first conductive bumps, and the underfill laterally encapsulating the dielectric layer, second sidewall portions of the first conductive bumps and sidewalls of the memory device. In some embodiments, the underfill is in contact with the second sidewall portions of the first conductive bumps, and the underfill is spaced apart from the first sidewall portions of the first conductive bumps by the dielectric layer.

In accordance with some embodiments of the present disclosure, a method including following steps is provided. A semiconductor die having first conductive bumps is provided, wherein at least one of the first conductive bumps comprising a first pillar portion and a second pillar portion disposed on the first pillar portion, and a first width of the first pillar portion is greater than a second width of the second pillar portion. A memory device having second conductive bumps are provided. The semiconductor die and the memory device are disposed on a substrate such that a first gap between the semiconductor die and the substrate is greater than a second gap between the memory device and the substrate. In some embodiments, the method further includes: laterally encapsulating the semiconductor and the memory device with an insulating encapsulation. In some embodiments, the method further includes: forming a dielectric layer covering the semiconductor die and partially encapsulating sidewalls of the first pillar portion; and filling the first gap and the second gap with an underfill. In some embodiments, the dielectric layer is formed through a dispensing process followed by a curing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a substrate;
   a semiconductor die disposed over the substrate;
   a first conductive bump disposed on and electrically connected to the semiconductor die, wherein a first width of a first end of the first conductive bump is greater than a second width of a second end of the first conductive bump, and the first end is opposite to the second end; and
   a memory device disposed on and electrically connected to the substrate, wherein a first distance between the semiconductor die and the substrate is greater than a second distance between the memory device and the substrate, wherein the substrate comprises second conductive bumps, a third width of the second conductive bumps is greater than the second width of the second end, and the third width of the second conductive bumps is substantially equal to the first width of the first end.

2. The package structure as claimed in claim 1, wherein a rear surface of the semiconductor die is substantially leveled with a top surface of the memory device.

3. The package structure as claimed in claim 1, wherein the substrate comprises second conductive bumps, a third width of the second conductive bumps is greater than the second width of the second end, and the third width of the second conductive bumps is different from the first width of the first end.

4. The package structure as claimed in claim 1, wherein the first conductive bump comprises a first conductive pillar and a second conductive pillar disposed between the first conductive pillar and the substrate, and a ratio of a first height of the first conductive pillar to a second height of the second conductive pillar ranges from about 1 to about 5.

5. The package structure as claimed in claim 1, wherein a ratio of the second width to the first width is greater than about 0.5 and less than about 1.

6. The package structure as claimed in claim 1, wherein the first conductive bump comprises a first conductive pillar and a second conductive pillar disposed between the first conductive pillar and the substrate, and the first conductive pillar is wider than the second conductive pillar.

7. The package structure as claimed in claim 1 further comprising:
a dielectric layer, wherein the first conductive bump comprises a first conductive pillar and a second conductive pillar disposed between the first conductive pillar and the substrate, and the dielectric layer partially encapsulates sidewalls of the first conductive pillar, and the dielectric layer is not in contact with the second conductive pillar.

8. The package structure as claimed in claim 1 further comprising an insulating encapsulation laterally encapsulating the semiconductor die and the memory device.

9. A structure, comprising:
a substrate;
a semiconductor die disposed over the substrate;
first conductive bumps disposed between and electrically connected to the substrate and the semiconductor die, at least one of the first conductive bumps comprising a first end and a second end, wherein the first end is located between the second end and the substrate, and the first end is wider than the second end;
a memory device disposed on and electrically connected to the substrate;
second conductive bumps disposed between and electrically connected to the substrate and the memory device, wherein the first conductive bumps are higher than the second conductive bumps in relation to the substrate; and
an insulating encapsulation laterally encapsulating the semiconductor die and the memory device, wherein a surface of the insulating encapsulation is substantially leveled with a rear surface of the semiconductor die and a top surface of the memory device.

10. The structure as claimed in claim 9, wherein the at least one of the first conductive bumps comprises a first pillar portion having a first constant width and a second pillar portion having a second constant width, the first pillar portion is higher than the second pillar portion, and the first constant width is greater than the second constant width.

11. The structure as claimed in claim 10, wherein the substrate comprises third conductive bumps, and wherein the first pillar portion and the third conductive bumps are substantially identical in width.

12. The structure as claimed in claim 9, wherein the substrate comprises third conductive bumps in contact with and electrically connected to the second end of the first conductive bumps.

13. The structure as claimed in claim 12, wherein the third conductive bumps are wider than the second end of the first conductive bumps.

14. The structure as claimed in claim 12, wherein the first end of the first conductive bumps and the third conductive bumps are substantially identical in width.

15. The structure as claimed in claim 9 further comprising:
a dielectric layer encapsulating first sidewall portions of the first conductive bumps; and
an underfill laterally encapsulating the dielectric layer, second sidewall portions of the first conductive bumps and sidewalls of the memory device.

16. The structure as claimed in claim 15, wherein the underfill is in contact with the second sidewall portions of the first conductive bumps, and the underfill is spaced apart from the first sidewall portions of the first conductive bumps by the dielectric layer.

17. A method, comprising:
providing a semiconductor die having first conductive bumps, wherein at least one of the first conductive bumps comprising a first end and a second end, wherein the first end is located between the second end and the substrate, and the first end is wider than the second end;
providing a memory device having second conductive bumps; and
disposing the semiconductor die and the memory device on a substrate such that a first gap between the semiconductor die and the substrate is greater than a second gap between the memory device and the substrate; and
laterally encapsulating the semiconductor and the memory device with an insulating encapsulation, wherein a rear surface of the semiconductor die is substantially leveled with a top surface of the memory device, and the rear surface of the semiconductor die and the top surface of the memory device are substantially leveled with a surface of the insulating encapsulation.

18. The method as claimed in claim 17, wherein the at least one of the first conductive bumps comprises a first pillar portion having a first constant width and a second pillar portion having a second constant width, the first pillar portion is higher than the second pillar portion, the substrate comprises third conductive bumps, the first end is wider than the second end, and the first end and the third conductive bumps are substantially identical in width.

19. The method as claimed in claim 17 further comprising:
forming a dielectric layer covering the semiconductor die and partially encapsulating sidewalls of the first conductive bumps; and
filling the first gap and the second gap with an underfill.

20. The method as claimed in claim 19, wherein the dielectric layer is formed through a dispensing process followed by a curing process.

* * * * *